(12) United States Patent
Ueda

(10) Patent No.: US 8,877,079 B2
(45) Date of Patent: Nov. 4, 2014

(54) METHOD AND APPARATUS FOR MANUFACTURING A SEMICONDUCTOR DEVICE

(75) Inventor: Yasuhiko Ueda, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 1191 days.

(21) Appl. No.: 12/073,177

(22) Filed: Feb. 29, 2008

(65) Prior Publication Data

US 2008/0227225 A1  Sep. 18, 2008

(30) Foreign Application Priority Data

Mar. 1, 2007  (JP) ................. 2007-051407

(51) Int. Cl.
- *G01R 31/00* (2006.01)
- *H01L 21/00* (2006.01)
- *H01L 21/302* (2006.01)
- *H01J 37/32* (2006.01)
- *H01L 21/66* (2006.01)

(52) U.S. Cl.
CPC ..... *H01J 37/32935* (2013.01); *H01J 37/32972* (2013.01); *H01L 22/20* (2013.01)
USPC ............ 216/59; 216/58; 438/9; 438/709

(58) Field of Classification Search
None
See application file for complete search history.

(56) References Cited

U.S. PATENT DOCUMENTS

| | | | |
|---|---|---|---|
| 5,989,929 A * | 11/1999 | Nikoh et al. ............... | 438/9 |
| 6,475,918 B1 | 11/2002 | Izawa et al. | |
| 6,635,185 B2 * | 10/2003 | Demmin et al. ............. | 216/64 |
| 7,183,219 B1 * | 2/2007 | Hama et al. ................ | 438/706 |
| 2003/0232504 A1 * | 12/2003 | Eppler et al. .............. | 438/709 |
| 2005/0263487 A1 * | 12/2005 | Tsuchiya ................. | 216/67 |

FOREIGN PATENT DOCUMENTS

| | | |
|---|---|---|
| JP | 11-195644 | 7/1999 |
| JP | 11-238723 A | 8/1999 |
| JP | 2000-200772 | 7/2000 |
| JP | 2001-110784 A | 4/2001 |
| JP | 2003-232678 A | 8/2003 |

OTHER PUBLICATIONS

Sennikov et al., "Fabrication of Nanocrystalline Silicon Layers by Plasma Enhanced Chemical Vapor Deposition from Silicon Tetrafluoride," Semmiconductors, vol. 43, No. 7, pp. 968-972, 2009.*

An English translation of a Japanese Office Action dated Sep. 10, 2013.

* cited by examiner

*Primary Examiner* — Shamim Ahmed
*Assistant Examiner* — Bradford Gates
(74) *Attorney, Agent, or Firm* — McGinn IP Law Group, PLLC

(57) ABSTRACT

The present invention relates to a method of manufacturing a semiconductor device wherein etching is performed on films on a wafer using a plasma treatment apparatus. In the manufacturing method according to the present invention, a change in the difference between the emission intensities of a first wavelength component and a second wavelength component in plasma is monitored during etching. If the amount of change in the difference per unit time exceeds a predetermined threshold a given number of times in a row, then the flow rate of oxygen introduced to the plasma treatment apparatus is increased or, if the amount of change exceeding the predetermined threshold has not been seen, then the oxygen flow rate is set back to the original value thereof. This series of actions is repeated all the time during a set period of time.

12 Claims, 3 Drawing Sheets

WHEN O₂ FLOW RATE IS 25 SCCM

WHEN STATE TEMPERATURE IS 60°C

O₂ FLOW RATE = 25 SCCM → 45 SCCM
(75 SEC LATER)

STAGE TEMPERATURE = 60°C
(ADDITION OF O₂ and CF₄ 109 SEC LATER)

METHOD AND APPARATUS FOR MANUFACTURING A SEMICONDUCTOR DEVICE

This application is based upon and claims the benefit of priority from Japanese patent application No. 2007-051407, filed on Mar. 1, 2007, the disclosure of which is incorporated herein in its entirety by reference.

BACKGROUND OF THE INVENTION

1. Field of the Invention

The present invention relates to a method and an apparatus used in a process of dry-etching films on a wafer to form contact holes, including via holes and through holes, (hereinafter referred to as contact etching) in the manufacture of semiconductor devices, such as ULSIs.

2. Description of the Related Art

As one of the most fearful failures in contact etching, there is mentioned "etch-stop." Etch-stop refers to a phenomenon in which etching stops while in progress.

Etch-stop can be roughly classified into two cases. The first case is a phenomenon in which the amount of seed depositions is excessively larger than the amount of ions contributing to etching and, therefore, the taper angle of a hole becomes large, which causes the hole to fail to penetrate through a film to-be-etched and which causes the hole's leading end to close. The second case is a phenomenon in which etching stops abruptly when etching is being performed in a favorable shape.

If such an etch-stop, as described above occurs all over the wafer plane, all of the devices formed on the wafer become defective.

In a mass-production plant, several thousand wafers are continuously transported within the reaction compartment (hereinafter referred to as the chamber) of a plasma treatment apparatus. In this case, the state of the chamber may change with time and etch-stop may result while several thousand wafers are being etched, even if conditions for deriving the best etching performance have been set in the initial phase of mass production. Specifically, the chamber state changes and etch-stop occurs because parts are worn, or because deposits are accumulated on the inner walls of the chamber.

Hence, currently, etching conditions allowing significant margins are set from the beginning of manufacture, so that etch-stop does not occur even if the chamber state more or less changes. In the case of insulating film etching, etch-stop occurs mostly due to the above-described first case wherein the amount of seed depositions in plasma becomes excessively large. Accordingly, as an example of a specific method, an oxygen flow rate is set approximately 5 sccm higher than the best flow rate condition. However, etch-stop due to the above-described second case infrequently occurs just because etching slightly deviates from favorable etching conditions. Hence, there has been a large need in mass-production sites for apparatus and recipes in which etch-stop never occurs even if the chamber state changes while the best etching conditions remain unchanged.

In addition, the performance required for contact etching has become increasingly higher along with miniaturization of semiconductor devices.

For example, requirements when forming contact holes having a high aspect ratio (depth/inner diameter) in a 60 nm-generation DRAM manufacturing process include an etching rate of 700 nm/min or higher, a selectivity to mask of 7 or higher, a selectivity to substrate of 50 or higher, a dimensional shift of 5 nm or less, a taper angle of 89° or larger, no bowing, no etch-stop, and so on. Here, bowing refers to a phenomenon in which the cross section of a sidewall within a hole forms into an arch. The most important of these requirements is "no etch-stop." This is because the occurrence of etch-stop directly leads to a yield decrease, thereby causing a serious problem.

In the contact etching of such devices as described above, the etching rate, the selectivity to mask, the selectivity to substrate, the dimensional shift, the amount of bowing, and the like are sacrificed to a great extent, if the oxygen flow rate is set higher than the best flow rate condition for deriving necessary etching performance in order to avoid etch-stop. Therefore, it becomes less easy to secure etching conditions allowing margins at the time of mass production since the performance (specifications) required for etching becomes severer along with the advance in device miniaturization.

Accordingly, there is a strong need to consistently apply the best etching conditions to all wafers.

Note that Japanese Patent Laid-Open No. 2000-200772 (hereinafter referred to as Patent Document 1) proposes a method of preventing the occurrence of etch-stop by increasing the amount of $O_2$ added to a treatment gas, either continuously or in stages, according to a change in the content of each constituent in plasma at the time of high-aspect ratio contact etching. However, this document does not describe at all the steps that need to be taken after etch-stop is avoided. If the additive amount of $O_2$ that increased from the start of etching remains unchanged after the avoidance of etch-stop, it may become no longer possible to satisfy the specifications required for contact etching, including the etching rate, the selectivity to mask, the selectivity to substrate, the dimensional shift, and the amount of bowing.

In addition, Japanese Patent Laid-Open No. 11-195644 (hereinafter referred to as Patent Document 2) discloses a method of measuring the emission intensities of C, F and O in plasma during etching to adjust the concentrations thereof, for the same purpose as in Patent Document 1, so that the ratio among these constituents falls within such a correct range as not to cause etch-stop. However, this method requires that the flow rates of various gases be controlled in order to always maintain the emission intensities of C, F and O in plasma within correct ranges, thereby causing control configuration to become complicated.

SUMMARY OF THE INVENTION

An object of the present invention is to provide a method and an apparatus for manufacturing a semiconductor device capable of solving any one of the problems conceivable in the above-described related arts that may occur. Another object of the present invention is to provide a method and an apparatus which do not require setting etching conditions allowing excessive margins in high-aspect ratio contact etching that is used in ULSI manufacturing and which can prevent the occurrence of etch-stop even if the chamber state changes while the best etching conditions remain unchanged during mass production.

In one aspect of the present invention, there is provided a method of manufacturing a semiconductor device wherein etching is performed on films on a wafer using a plasma treatment apparatus. In particular, there is provided a manufacturing method in which a change in the difference between the emission intensities of a first wavelength component and a second wavelength component in plasma is monitored during etching and, if the amount of change in the difference per unit time exceeds a predetermined threshold a given number of times in a row, then the flow rate of oxygen introduced to the plasma treatment apparatus is increased or, if the amount of change no longer exceeds the predetermined threshold, then the oxygen flow rate is set back to the original value thereof. As a result, it is possible to prevent the occurrence of etch-stop while keeping the best etching performance as is, thereby solving the above-described problem.

In another aspect of the present invention, there is provided an apparatus for manufacturing a semiconductor device wherein etching is performed on films on a wafer. This apparatus includes a reaction compartment for performing etching on films on a wafer, a first emission intensity monitor for monitoring a change in the emission intensity of a first wavelength component in plasma produced within the reaction compartment according to an etching time, a second emission intensity monitor for monitoring a change in the emission intensity of a second wavelength component in plasma produced within the reaction compartment according to an etching time, and an oxygen flow rate controller for controlling the flow rate of oxygen introduced to the reaction compartment according to the outputs of the first and second emission intensity monitors.

The oxygen flow rate controller calculates a rate of change per unit time in the difference between the emission intensities output from the first and second emission intensity monitors respectively during etching and, if this rate of change exceeds a predetermined threshold a given number of times in a row, then the oxygen flow rate controller increases the oxygen flow rate and continues to calculate the rate of change thereafter or, if the rate of change does not exceed the predetermined threshold at all for a given period of time, then sets back the oxygen flow rate to the original value thereof.

In this case, it is preferable that a determination as to whether or not the predetermined threshold is exceeded be made within a predetermined set time during etching.

In addition, the first wavelength component, the emission intensity of which is monitored using the method and apparatus described above, is a CFx radical having an emission wavelength of 260 nm and, likewise, the second wavelength component is a SiFx radical having an emission wavelength of 440 nm.

The above and other objects, features and advantages of the present invention will become apparent from the following description with reference to the accompanying drawings which illustrate examples of the present invention.

DETAILED DESCRIPTION OF THE PREFERRED EMBODIMENTS

The exemplary embodiments of the present invention are based on the mechanism of the occurrence of etch-stop described in detail hereinafter. As described in the Related Art section, there are two cases in which etch-stop occurs. The first case is that etch-stop occurs because the amount of seed depositions in plasma becomes excessively large, as described in the Related Art section. On the other hand, the second case of etch-stop occurs when several conditions coincide. Here, consideration will be made in particular to the mechanism of the occurrence of the second case.

Figure 1A:
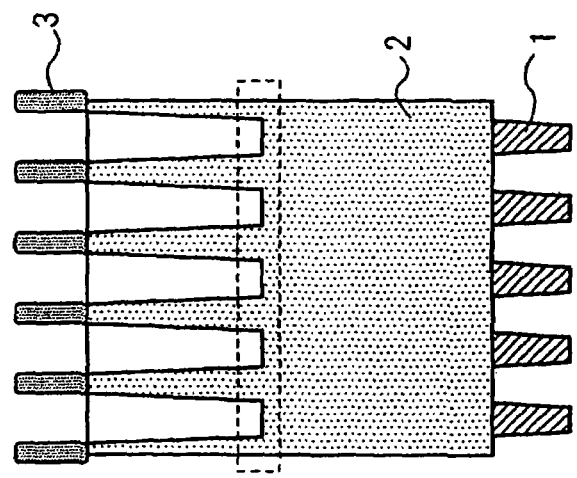
FIGS. 1(*a*)-1(*b*) are schematic views in which a cross-sectional shape is compared between a case in which a treatment has been performed normally in contact etching and a case in which etch-stop has occurred.
Figure 1B:
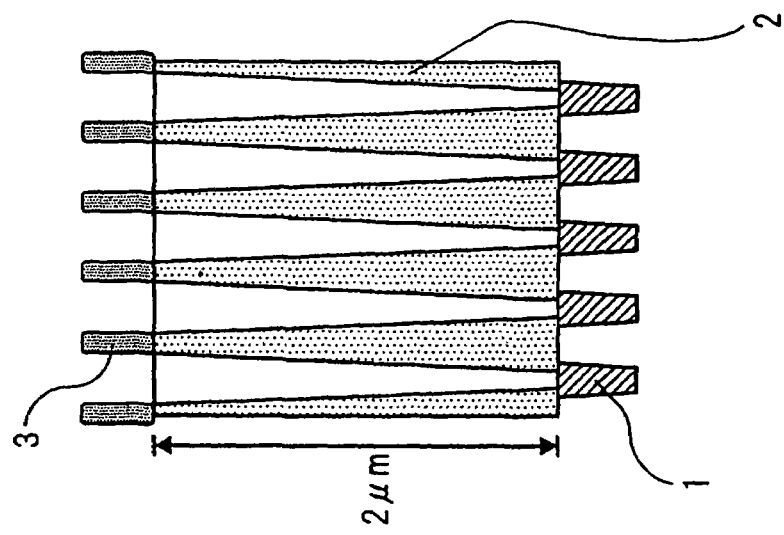

FIG. 1 is a schematic view in which a cross-sectional shape is compared between a case in which treatment has been performed normally in contact etching (FIG. 1*a*) and a case in which etch-stop has occurred (FIG. 1*b*). In this figure, contact plugs 1 (material: poly-Si) that are to be connected to transistors are formed on the surface layer of a silicon wafer, and film 2 (material: $SiO_2$) that is to be etched is formed so as to cover this wafer surface layer. Then, etching mask 3 (material: photoresist, SiN, poly-Si, or the like) is formed on film 2 that is to be etched and contact etching is carried out. The opening diameter of the hole pattern of etching mask 3 was set to 60 nm and the thickness of film 2 that is to be etched was set to 2 μm.

As conditions in which etch-stop occurs during contact etching in such a film configuration as described above, there is empirically known the fact that the depth of the contact holes is approximately 1 μm, as shown in FIG. 1*b*, and that the wafer temperature or the temperature of the top plate of a chamber is higher than a set temperature. Note that the portion enclosed by the dotted line in FIG. 1*b* is where etch-stop occurred.

The depth of approximately 1 μm means a depth at which it becomes difficult for ions that contribute to etching to reach the bottoms of the holes due to a shielding effect caused by charge-up. On the other hand, since electrons in depositions are almost neutral, the electrons can easily reach the bottoms of such approximately 1 μm deep holes.

That is, positive ions are accelerated by a sheath during etching and enter the holes, whereas electrons enter the holes isotropically. Accordingly, if the holes' inner diameter becomes smaller, some electrons do not enter the holes whereas other electrons do, and lower sidewalls within the holes are electrified with positive charges. If the amount of these positive charges becomes larger than a given value, ions are no longer able to enter the holes and, therefore, do not reach the bottoms thereof. This is referred to as a shielding effect due to charge-up. As a result, the balance between ions and radicals disrupts, thereby causing etch-stop.

In addition, the temperature of a wafer itself begins to rise above a set temperature as etching proceeds to a depth of 1 μm. As a result, the probability of seed depositions being adsorbed onto the wafer surface decreases. Thus, seed depositions are more likely to enter the holes without being adsorbed by the wafer surface. This further facilitates the occurrence of etch-stop.

In addition, seed depositions which adhered to the chamber top plate in the initial phase of etching are more likely to descend again onto the wafer side if the temperature of the chamber's top plate also rises. At this moment, etch-stop unfailingly occurs even if the chamber state changes slightly.

Furthermore, if etch-stop occurs, a discriminative change is seen in the emission intensity of a specific constituent in plasma.

Figure 2A:
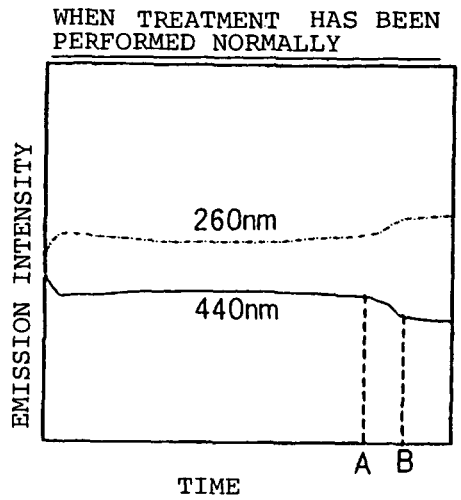
FIGS. 2(*a*)-2(*b*) are graphical views in which a change in the waveform that represents plasma emission spectroscopy is compared between a case in which a treatment has been performed normally and a case in which etch-stop has occurred.
Figure 2B:
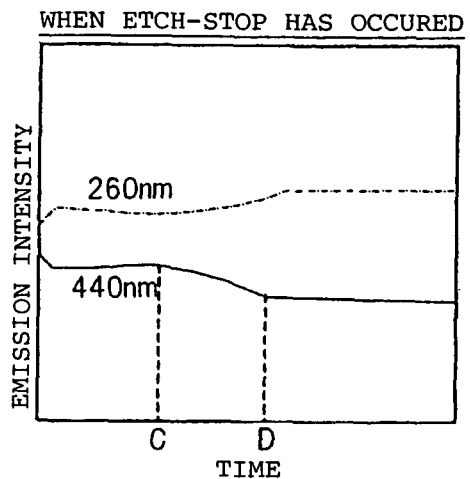

FIG. 2 shows the emission intensity transitions of 260 nm and 440 nm wavelengths while contact etching is being performed on an $SiO_2$ film. In addition for the purpose of comparing emission waveforms, FIG. 2a shows a graph when treatment has been performed normally and FIG. 2b shows a graph when etch-stop has occurred. Note that the axis of abscissa of each graph represents the etching time and the axis of ordinate represents the emission intensity. In addition, the chain line in each graph denotes an emission waveform having a 260 nm wavelength and the solid line denotes an emission waveform having a 440 nm wavelength. The value 260 nm refers to the emission wavelength of fluorocarbon radicals (CFx) in plasma and the value 440 nm refers to the emission wavelength of silicon fluoride radicals (SiFx) in plasma.

As can be seen from FIG. 2a, the emission waveform of each wavelength when a treatment has been performed normally makes a flat form up to time A, whereas the emission intensity of the 440 nm wavelength drastically decreases in a period from time A to B. In contrast, the emission intensity of the 260 nm wavelength increases drastically. That is, SiFx radicals which are etching products drastically decrease in the period from time A to B. As a result, CFx radicals which are an etching gas are oversupplied and, therefore, increase drastically.

On the other hand, as shown in FIG. 2b, the emission intensity of the 440 nm wavelength begins to gradually decrease from time C, significantly earlier than the planned etching end time, in a case where etch-stop occurs. As a result, the emission intensity of the 440 nm wavelength increases gradually. That is, SiFx radicals begin to gradually decrease from time C and, consequently, surplus CFx radicals begin to gradually increase within the chamber. After that, the above-described waveform change continues over a significantly long period of time and the emission waveforms of both the 260 nm and 440 nm wavelengths become almost flat as they pass over time D.

Referring to FIGS. 2a and 2b, the waveform change, when a treatment has been performed, normally closely resembles the waveform change when etch-stop has occurred. However, these waveform changes differ from each other in the following point.

In most cases, etch-stop occurs in the initial phase of etching (approximately 1 mm if expressed in terms of contact depth). In addition, the waveform change continues for a comparatively longer period of time than the period in the normal treatment, and the amount of waveform change increases during that period.

Accordingly, by monitoring a change in the waveform that represents plasma emission spectroscopy while carrying out contact etching, it is possible to previously detect the occurrence of etch-stop.

By taking advantage of the features of such a waveform that represents plasma emission spectroscopy as described above, the inventor has conceived a method and an apparatus in accordance with the present invention described herein. Hereinafter, exemplary embodiments of the present invention will be described.

Figure 3:
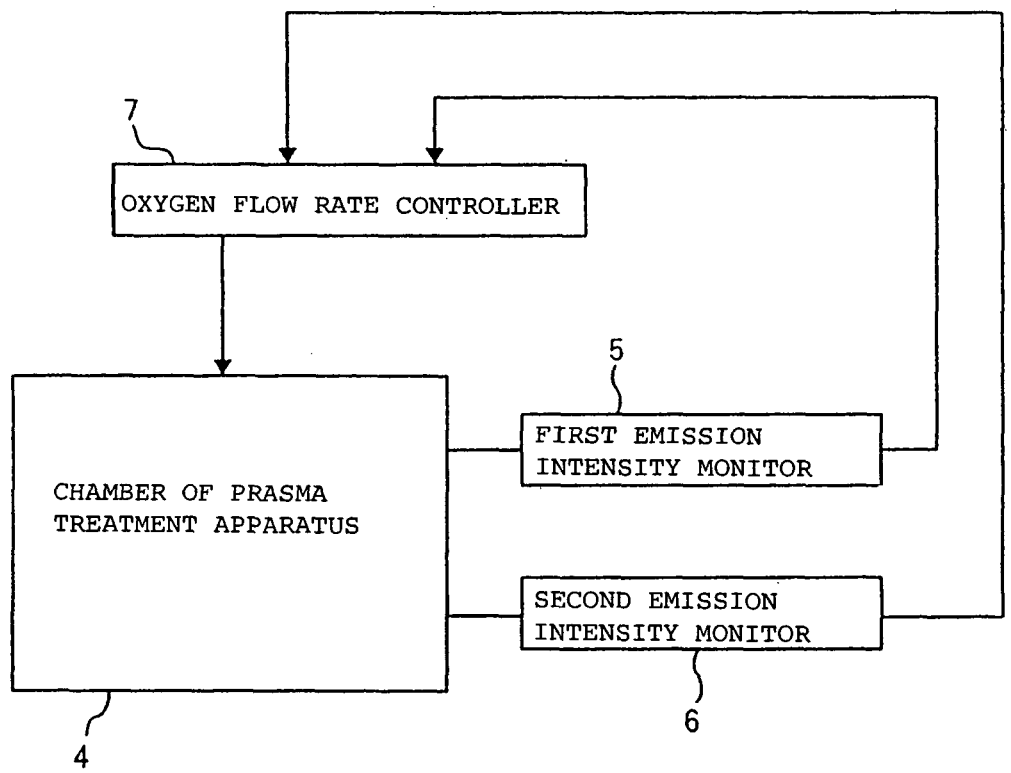
FIG. 3 is a block diagram showing a control system for carrying out a method in accordance with the present invention.

FIG. 3 is a block diagram showing a control system for carrying out a method in accordance with the present invention. As shown in this figure, chamber 4 of a plasma treatment apparatus is provided with first emission intensity monitor 5, second emission intensity monitor 6, and oxygen flow rate controller 7.

First emission intensity monitor 5 monitors a temporal change in the emission intensity of CFx radicals in plasma produced in the reaction compartment of chamber 4.

Second emission intensity monitor 6 monitors a temporal change in the emission intensity of SiFx radicals in plasma produced in the reaction compartment of chamber 4.

Oxygen flow rate controller 7 predicts the occurrence of etch-stop according to the outputs of emission intensity monitors 5 and 6 and controls the flow rate of oxygen introduced into the reaction compartment of chamber 4, so that etch-stop is prevented.

The operation of oxygen flow rate controller 7 will be described in further detail.

This oxygen flow rate controller 7 calculates the rate of change per unit time in the difference between the emission intensities of CFx and SiFx radicals output from emission intensity monitors 5 and 6 within a set period of time during etching. The oxygen flow rate controller determines that "etch-stop will occur" if this rate of change exceeds a predetermined threshold a given number of times in a row, and increases the oxygen flow rate. Still after this increase, the oxygen flow rate controller continues to calculate the above-described rate of change until the end of the set period of time. If the rate of change does not exceed the threshold at all for a given period of time, then the oxygen flow rate controller determines that "etch-stop has been presented" and sets the oxygen flow rate back to the original value thereof. The oxygen flow rate controller repeats this series of actions continuously during the set period of time.

For example, when a D μm deep contact hole is processed, the oxygen flow rate controller determines, within a time frame of 0.7 T/D to 1.3 T/D (sec) for predicted etching end time T (sec), that "etch-stop will occur" if a phenomenon, in which the differential waveform between the emission intensities of the 440 nm and 260 nm wavelengths shown in FIG. 2 changes by at least 0.5% during one second, and occurs three times or more in a row. Thus, the oxygen flow rate controller increases the ratio of the flow rate of oxygen in a process gas. Specifically, it is preferable that the oxygen flow rate be 1.5 to 2 times the flow rate of oxygen that flowed up to that time. In addition, still after the flow rate increase, the oxygen flow rate controller continues to monitor the rate of change in the differential waveform between the 440 nm and 260 nm wavelengths. As the result of monitoring, the oxygen flow rate controller determines that "etch-stop has been presented" at the moment when the phenomenon, in which the differential waveform changes by at least 0.5% during one second, does not occur at all for a period of 5 seconds, and sets the oxygen flow rate back to the original value thereof. The oxygen flow rate controller repeats this series of actions continuously during the set period of time. When increasing the oxygen flow rate, it is preferable that the amount of increase be gradually adjusted while observing how the phenomenon, in which the differential waveform changes by at least 0.5% during one second, fades away. If the phenomenon still persists, it is effective to simultaneously add $CF_4$, depending on the process gas system used.

Note that a time-domain setting for performing the above-described operation and settings of a threshold for determining the occurrence of etch-stop, the number of times this threshold is exceeded, the determination time, and the like are not limited to the aforementioned values. Rather, it is preferable to set appropriate values depending on the etching apparatus and recipes applied.

Hereinafter, a description will be made of data obtained when experiments were conducted by applying the above-described control system to 2000 nm deep cylinder etching (etching of contact holes for capacitors) in a DRAM.

Sample Structure

Whereas the basic structure of the sample used is as shown in FIG. 1, poly-Si (500 nm thick) was applied to etching mask 3. For film 2 that is to be etched, a plasma-TEOS $SiO_2$ film formed on a φ200 mm wafer was used.

Etching Apparatus and Recipes

As an etching apparatus for processing the above-described sample, a commercially available parallel plate type RIE apparatus was used. An etching recipe was specified as $C_5F_8/Ar/O_2$=25/700/30 sccm (flow rates of various gases introduced into reaction compartment), internal pressure of reaction chamber=20 mTorr, and high-frequency power (upper electrode/lower electrode)=1800 W/1750 W (stage temperature=40° C.).

Emission Waveform Changes at the Time of Normal Etching

In the normal etching of the above-described sample, the sample exhibited the emission waveform change shown in FIG. 2. In this case, time A and time B in the figure were 186 seconds and 190 seconds, respectively.

Conditions Whereunder Etch-Stop Occurred

Figure 4A:
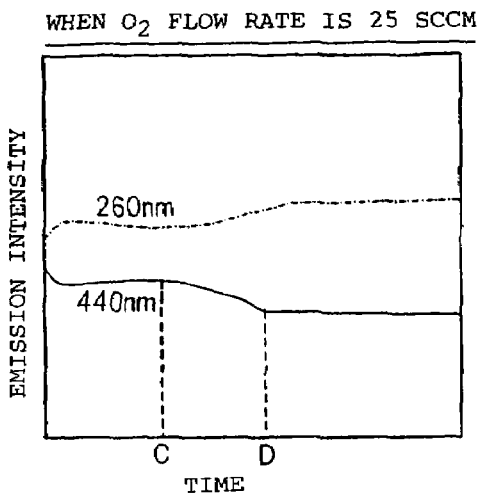
FIGS. 4(*a*)-4(*b*) are graphical views showing a change in the waveform that represents plasma emission spectroscopy as classified by the etching conditions in a case in which etch-stop has occurred.
Figure 4B:
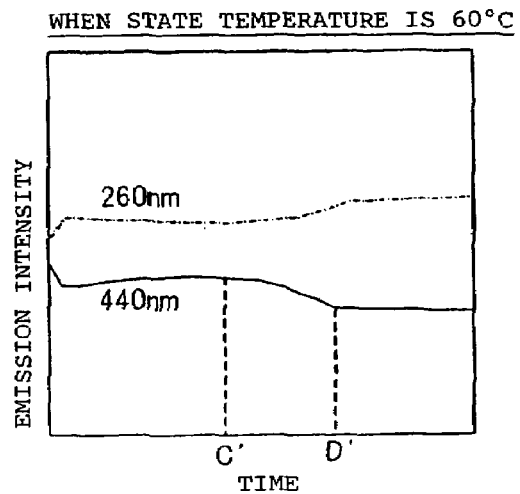

In the contact etching of the above-described sample, etch-stop occurred when the recipe was changed to (1) $O_2$ flow rate=25 sccm and (2) stage temperature=60° C. FIGS. 4a and 4b show emission waveform changes in these cases.

In the case of (1) $O_2$ flow rate=25 sccm, time C at which the difference between the emission intensities of 260 nm and 440 nm wavelengths began to change was 71 seconds and time D at which the change then almost terminated was 81 seconds, as shown in FIG. 4a. At this point, the depth of etch-stop was 805 to 865 nm, and etch-stop occurred in a region approximately φ40 mm around the center of the wafer.

In the case of (2) stage temperature=60° C., time C' at which the difference between the emission intensities of 260 nm and 440 nm wavelengths began to change was 104 seconds and time D' at which the change then almost terminated was 116 seconds, as shown in FIG. 4b. At this point, the depth of etch-stop was 1070 to 1150 nm, and etch-stop occurred in a region approximately 30 mm from the edge of the wafer.

Avoidance of Etch-Stop

Figure 5A:
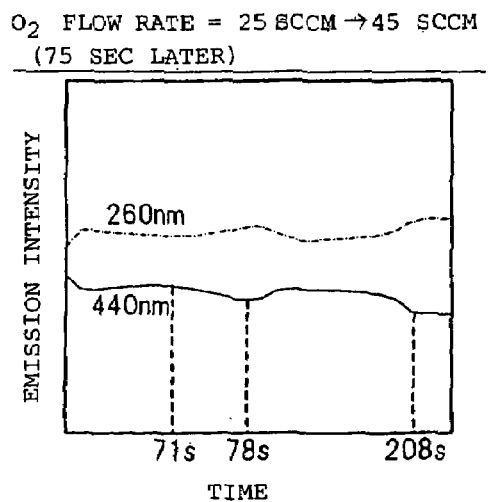
FIGS. 5(*a*)-5(*b*) are graphical views showing a change in the waveform that presents plasma emission spectroscopy as classified by the etching conditions in a case in which etch-stop has been avoided by the present invention.
Figure 5B:
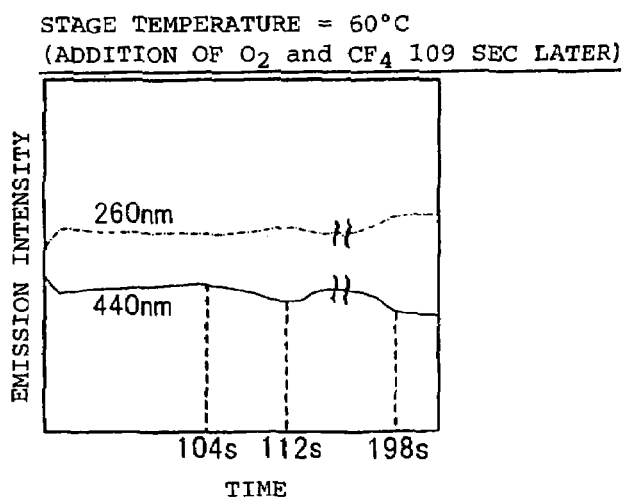

Next, a description will be made of data obtained when the present invention was applied under the same conditions as the above-described conditions under which etch-stop occurred. FIGS. 5a and 5b show emission waveform changes when the above-described control system was applied in cases where (1) $O_2$ flow rate=25 sccm and (2) stage temperature=60° C.

In the case of (1) $O_2$ flow rate=25 sccm, the difference between the emission intensities of the 260 nm and 440 nm wavelengths began to gradually change in 71 seconds from the start of etching, as shown in FIG. 5a. Then, the control system changed the $O_2$ flow rate to 45 sccm in 75 seconds from the start of etching since it determined from the transition of this rate of change that "etch-stop would occur." Consequently, the rise in the emission waveform of the 260 nm wavelength and the fall in the emission waveform of the 440 nm wavelength stopped 3 seconds later (in 78 seconds from the start of etching) and the control system moved toward a steady state. Then, the control system set the $O_2$ flow rate back to the original value thereof (25 sccm) since the condition whereby a determination can be made that "etch-stop will occur" did not take place at all for a given period of time. In this way, etching ended in 208 seconds from the start thereof without involving any etch-stop. In addition, normal etching shapes were confirmed at both the center and the edge of the wafer.

In the case of (2) stage temperature=60° C., the difference between the emission intensities of the 260 nm and 440 nm wavelengths began to gradually change in 104 seconds from the start of etching, as shown in FIG. 5b. Then, the control system changed the $O_2$ flow rate to 45 sccm in 109 seconds from the start of etching since it determined from the transition of this rate of change that "etch-stop would occur." However, the rise in the emission waveform of the 260 nm wavelength and the fall in the emission waveform of the 440 nm wavelength did not stop completely and this condition did not change even if the $O_2$ flow rate was increased up to 50 sccm. Hence, $CF_4$ with a flow rate of 10 sccm was added, at the same time as changing the $O_2$ flow rate to 45 sccm as described above. Consequently, the rise in the emission waveform of the 260 nm wavelength and the fall in the emission waveform of the 440 nm wavelength stopped 3 seconds later (in 112 seconds from the start of etching) and the control system moved toward a steady state.

Then, the control system set the $O_2$ flow rate back to the original value thereof (30 sccm) since the condition whereby a determination can be made that "etch-stop will occur" did not take place at all for a given period of time. In this way, etching ended in 198 seconds from the start thereof without involving any etch-stop. In addition, normal etching shapes were confirmed at both the center and the edge of the wafer.

Such a method of preventing etch-stop as described above is applicable to approximately 2 to 3 μm deep etching of cylinders (contacts for capacitors) in a DRAM, approximately 3 to 4 μm deep through hole etching, and the like.

In addition, according to the present invention as illustrated above, it is possible to prevent etch-stop due to the effect of uncertain factors, such as the chamber state, by using a simple system in high-aspect ratio contact etching, without having to set etching conditions having excessive margins at the time of mass production. Consequently, it is possible to also satisfy stringent specifications required for contact etching.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a semiconductor device wherein etching is performed on films on a wafer using a plasma treatment apparatus, said manufacturing method comprising:
    monitoring changes in the emission intensities of a first wavelength component and a second wavelength component in plasma during etching;
    calculating a rate of change of a difference between the emission intensities of the first and second wavelength components, and increasing the flow rate of oxygen introduced to said plasma treatment apparatus if the rate of change exceeds a predetermined threshold within a predetermined period of processing time; and
    setting said oxygen flow rate back to the original value thereof if said rate of change exceeding said predetermined threshold is no longer seen.

2. The method of manufacturing a semiconductor device according to claim 1, wherein a determination as to whether said rate of change exceeds said predetermined threshold is made when the rate of change exceeds a predetermined threshold a given number of times in a row during etching.

3. The method of manufacturing a semiconductor device according to claim 1, wherein said first wavelength component is a CFx radical having an emission wavelength of 260 nm and said second wavelength component is a SiFx radical having an emission wavelength of 440 nm.

4. The method of manufacturing a semiconductor device according to claim 1, wherein the monitoring of the changes in the emission intensities of the first and second wavelength components comprises performing a plurality of measurements of the emission intensities of the first and second wavelength components over time.

5. The method of manufacturing a semiconductor device according to claim 4, wherein the calculating of the rate of change is based on the plurality of measurements.

6. The method of manufacturing a semiconductor device according to claim 5, wherein the calculating of the rate of change comprises continuously calculating the rate of change.

7. The method of manufacturing a semiconductor device according to claim 4, further comprising:
after the increasing of the flow rate of oxygen, continuing the monitoring of the changes in the emission intensities of the first and second wavelength components, and continuing the calculating of the rate of change of the emission intensities of the first and second wavelength components.

8. The method of manufacturing a semiconductor device according to claim 1, wherein the predetermined threshold comprises a change of 0.5% during one second and the given number of times comprises three or more times.

9. The method of manufacturing a semiconductor device according to claim 1, wherein the increasing of the flow rate of oxygen comprises increasing the flow rate of oxygen to be in a range from 1.5 times a flow rate of oxygen at the time of beginning the increasing of the flow rate of oxygen, to 2 times the flow rate of oxygen at the time of beginning the increasing of the flow rate of oxygen.

10. The method of manufacturing a semiconductor device according to claim 1, further comprising:
determining the period of processing time during which etch stop may occur during the etching.

11. The method of manufacturing a semiconductor device according to claim 10, wherein the monitoring of the changes in the emission intensities, and the calculating of the rate of change are performed until an end of the predetermined period of processing time.

12. The method of manufacturing a semiconductor device according to claim 10, wherein the determining of the period of processing time comprises determining the period of processing time based on a depth of a hole to be formed by the etching and a predicted end time of the etching.

* * * * *